US008031876B2

(12) United States Patent
Yoshino et al.

(10) Patent No.: US 8,031,876 B2
(45) Date of Patent: Oct. 4, 2011

(54) AUDIO SYSTEM

(75) Inventors: Hajime Yoshino, Tokorozawa (JP); Susumu Yamamoto, Tokorozawa (JP)

(73) Assignee: Pioneer Corporation, Tokyo (JP)

( * ) Notice: Subject to any disclaimer, the term of this patent is extended or adjusted under 35 U.S.C. 154(b) by 818 days.

(21) Appl. No.: 11/995,367

(22) PCT Filed: Jul. 4, 2006

(86) PCT No.: PCT/JP2006/313634
§ 371 (c)(1), (2), (4) Date: May 8, 2008

(87) PCT Pub. No.: WO2007/007695
PCT Pub. Date: Jan. 18, 2007

(65) Prior Publication Data
US 2009/0274307 A1 Nov. 5, 2009

(30) Foreign Application Priority Data
Jul. 11, 2005 (JP) ................................ 2005-202307

(51) Int. Cl.
*H04R 5/00* (2006.01)
*H04R 3/00* (2006.01)
*H03G 5/00* (2006.01)

(52) U.S. Cl. ............................... 381/59; 381/96; 381/63

(58) Field of Classification Search ............. 381/56–563
See application file for complete search history.

(56) References Cited

U.S. PATENT DOCUMENTS

2005/0053246 A1* 3/2005 Yoshino .......................... 381/96

FOREIGN PATENT DOCUMENTS

JP 9-327086 A 12/1997
JP 2002-330499 A 11/2002

* cited by examiner

*Primary Examiner* — Cuong Q Nguyen
(74) *Attorney, Agent, or Firm* — Sughrue Mion, PLLC

(57) ABSTRACT

Disclosed is an audio system including a group of loudspeakers that form a sound field by delivering into a single space sound signals passed through respective ones of a plurality of sound signal channels. This audio system is comprised of two characteristic-variable equalizers that are cascaded to each other to constitute a part of the sound signal channels; a sound field characteristics detecting part for supplying test signals through the sound signal channels and detecting sound pressure in the sound field and thereby obtaining a sound pressure signal; and a characteristics adjusting part for adjusting, based on the sound pressure signal, equalizing characteristics of the characteristic-variable equalizers individually and with respect to each of the sound signal channels. The sound field characteristics detecting part selectively generates test signals of different bands. The characteristics adjusting part adjusts equalizing characteristics of either one of the two characteristic-variable equalizers according to the band of the test signal.

7 Claims, 7 Drawing Sheets

AUDIO SYSTEM

TECHNICAL FIELD

The present invention relates to a high quality audio system having a plurality of sound signal channels and an audio technique relating thereto.

BACKGROUND ART

Like a 5.1 channel or 7.1 channel stereo system, an audio system having a plurality of sound signal channels and loudspeakers that provides a high quality sound space has come into wide use. In such a high quality audio system, it is extremely difficult for a user to appropriately adjust by him- or herself frequency and phase characteristics of reproduced sounds of respective channels, delivered from a plurality of loudspeakers such that the characteristics are suited for the sound field and thereby obtaining an optimum sound space that gives highly realistic sensations. For this reason, such an audio system is provided with a so-called automatic sound field correcting system, which automatically creates an optimum sound space by correcting sound field characteristics on the system's side.

As this kind of automatic sound field correcting system, a conventional art disclosed in, for example, Japanese Patent Application Laid-Open No. 2005-151402 or United States Patent Application Publication No. 2005/0137859 has been previously known. In this conventional art, a test signal such as a pink noise is outputted from the loudspeaker of each of the channels. The test signal is collected by a microphone and a sound pressure level thereof is measured. Based on the measurement data thus obtained, frequency and phase characteristics and the like of the sound field are calculated, and various parameters of a sound field correcting equalizer provided for each of the channels are adjusted. A sound field correction is thus performed.

To be more specific, in each of the channels the audible frequency band is divided into nine frequency bands, and the sound field correction is performed by using a fixed frequency band graphic equalizer (hereinafter referred to as "GEQ") having nine bands (63 Hz, 125 Hz, 250 Hz, 500 Hz, 1 kHz, 2 kHz, 4 kHz, 8 kHz, and 16 kHz). The selectivity factor (Q-factor) of these GEQs is suppressed to a relatively low value in order to prevent phase differences of sound signals from increasing among the channels even if equalizing characteristics are set differently in the respective channels.

Also, correspondingly to the characteristics of the GEQ, a band pass filter (hereinafter referred to as "BPF") with nine bands having low selectivity (Q-factor) is used as a BPF for analyzing sound pressure of the test signal collected by the microphone.

As described above, in the sound field correction according to the conventional art, a BPF or GEQ with low selectivity factor (Q-factor) is used in the measuring or correcting step. Therefore, the frequency resolution provided at the time of measuring or correcting is not high enough for a peak occurring in a narrow band, such as a peak generated by a standing wave due to low-frequency signal components. Consequently, when a measurement or correction is performed using such a BPF and GEQ, there have been a problem that suppression of a peak level can be achieved, however, surplus correction is performed on a spectrum of a broader band including the peak, and thus the frequency characteristics of a channel concerned are distorted.

In contrast, by using a so-called parametric equalizer, wherein a central frequency or the selectivity factor (Q-factor) thereof can be arbitrarily adjusted, it becomes possible with relative ease to follow a peak occurring in a narrow band generated by the standing wave, and an appropriate correction can be performed. However, a parametric equalizer has a problem that the equalizer generally has high selectivity factor (Q-factor) and reproduction of an ideal sound field is difficult to achieve due to disarrangement in the phase relationship among the respective channels that is caused when filters with different characteristics are inserted into the respective channels.

DISCLOSURE OF THE INVENTION

In view of the above, it is an object of the present invention to provide an audio system capable of appropriately correcting a peak caused in a narrow band due to effects of a standing wave or the like, producing no change in the phase relationship among the respective channels and thereby reproducing a correct sound field.

According to one aspect of the present invention, there is provided an audio system including a group of loudspeakers that form a sound field by delivering into a single space sound signals passed through respective ones of a plurality of sound signal channels, the audio system comprising: two characteristic-variable equalizers cascaded to each other to constitute a part of the sound signal channels; a sound field characteristics detecting part for supplying test signals through the sound signal channels and detecting sound pressure in the sound field and thereby obtaining sound pressure signals; and a characteristics adjusting part for adjusting, based on the sound pressure signals, equalizing characteristics of the characteristic-variable equalizers individually and in each of the sound signal channels, wherein the sound field characteristics detecting part selectively generates test signals of different bands, and wherein the characteristics adjusting part adjusts equalizing characteristics of either one of the two characteristic-variable equalizers according to the bands of the test signals.

MODE FOR CARRYING OUT THE INVENTION

According to a preferred embodiment of the present invention is provided an audio system including a group of loudspeakers that form a sound field by delivering into a single space sound signals passed through respective ones of a plurality of sound signal channels. This audio system is comprised of two characteristic-variable equalizers that are cascaded to each other to constitute a part of the sound signal channels; a sound field characteristics detecting part for supplying test signals through the sound signal channels and detecting sound pressure in the sound field and thereby obtaining sound pressure signals; and a characteristics adjusting part for adjusting, based on the sound pressure signals, equalizing characteristics of the characteristic-variable equalizers individually and with respect to each of the sound signal channels. The sound field characteristics detecting part selectively generates test signals of different bands. The characteristics adjusting part adjusts equalizing characteristics of either one of the two characteristic-variable equalizers according to the bands of the test signals.

According to this embodiment, a correction is performed in two steps: first, a low-frequency band wherein a peak generated by a standing wave occurs is corrected by one of the equalizers; then, correction characteristics obtained by the equalizer are added to the test signals to adjust equalizing characteristics to be used for correcting entire audible frequency band. Thus, it becomes possible to perform a well-balanced sound field correction over full band of the sound signals.

Figure 1:
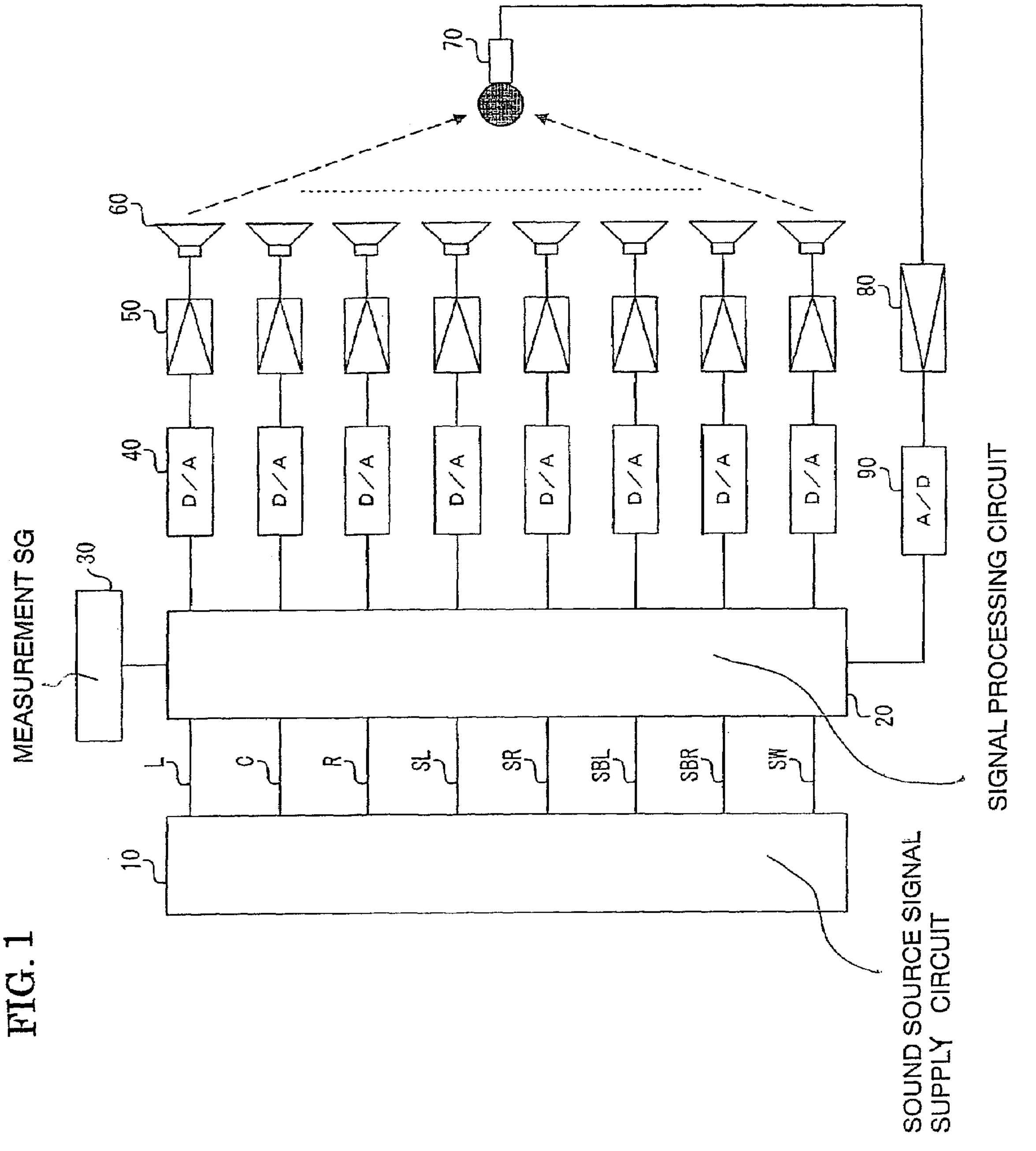
FIG. 1 is a block diagram showing the configuration of an audio system which is an embodiment of the present invention.

FIG. 1 shows the structure of an audio system which is an embodiment of the present invention.

In the figure, a sound source signal supply circuit 10 is a circuit or unit that serves as a supply source of an audio signal from, for example, a CD player or DVD player. In the present embodiment, the explanation will be given taking as an example the case of a multi-channel stereo system including a 7.1 channel system that has front-right and front-left loudspeaker channels (R, L), a center loudspeaker channel (C), right and left surround loudspeaker channels (SR, SL), and right and left surround back loudspeaker channels (SBR, SBL). However, it should be noted that the present invention is not limited to only a high quality stereo system having such a channel constitution.

A signal processing circuit 20 is a circuit for performing various correction processing on frequency characteristics or the like of sound signals supplied via each of the channels from the sound source signal supply circuit 10. Regarding the internal construction of the signal processing circuit 20, a more detailed explanation will be given with reference to a block diagram shown in FIG. 2, which will be discussed hereinafter below.

A measurement test signal generator (measurement SG) 30 (hereinafter referred to as "signal generator 30") is a circuit that generates a test signal for measuring sound field characteristics. In the present embodiment, two kinds of signals, a white noise and a pink noise, are used as a test signal for measuring a sound field. The pink noise has a spectrum obtained by assigning a weight of −3 dB/oct to a spectrum of the white noise. However, it goes without saying that the kind of the test signal to be used in the present embodiment is not limited to these signals. The pink noise is a signal that is obtained, for example, by filtering the white noise with a lowpass filter, and has a spectrum that decreases at a rate of −3 dB per octave (oct).

The signal processing in the signal processing circuit 20 is performed all in the digital domain. Thus, if a user wishes to obtain sound signals that are audible, such digital signals need to be converted into analog signals. A digital/analog (D/A) converter 40 (hereinafter referred to as "DAC 40") is a circuit for executing the signal conversion processing. A signal amplifier 50 is an amplifier circuit for amplifying an analog signal supplied from the DAC 40 to a predetermined level. As clearly shown in FIG. 1, the DAC 40 and the signal amplifier 50 are provided with respect to each of the channels of the multi-channel audio system.

A loudspeaker 60 is a device for converting the electric sound signal having been amplified to the predetermined level in the signal amplifier 50 into a sound signal that causes changes in sound pressure and delivering the signal into a sound space. The loudspeaker 60 may be configured to be of a type or have a shape, construction, or the like selected differently for the different channels, depending on the use of the respective channels, such as a front loudspeaker channel, surround loudspeaker channel, or surround back loudspeaker channel; or the frequency bands covered by the respective channels.

A microphone 70 is a device for detecting changes in sound pressure of the sound signal delivered from each of the loudspeakers 60 and converting the detected sound pressure changes into an electric signal. A signal amplifier 80 is a circuit for amplifying the electric signal supplied from the microphone 70 to a predetermined level. An analog/digital (A/D) converter 90 (hereinafter referred to as "ADC 90") is a circuit for converting an analog signal supplied from the signal amplifier 80 into a digital signal.

Although only one microphone 70 is shown in FIG. 1, the present invention is not limited to such an embodiment. Microphones may be provided at a plurality of positions within a sound field so that sound pressure can be measured at different positions within the sound field. Needless to say, the number of the signal amplifier 80 and the ADC 90, which are connected to the respective microphones, is increased with the addition of the microphones in this case.

Next, the internal construction of the signal processing circuit 20 will be explained with reference to a block diagram shown in FIG. 2.

Figure 2:
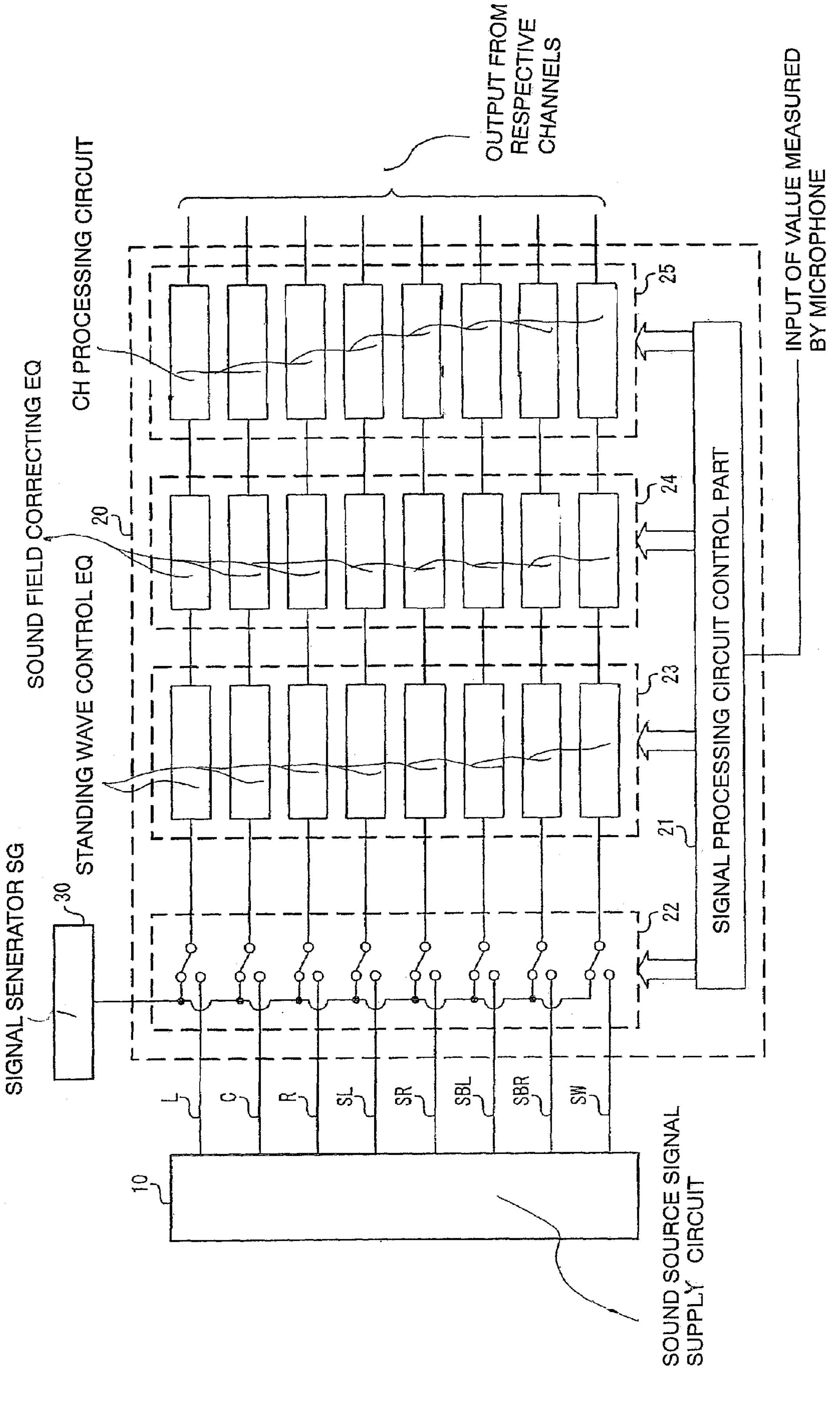
FIG. 2 is a block diagram showing the internal construction of a signal processing circuit 20 in the audio system of FIG. 1.

In FIG. 2, a signal processing circuit control part 21 (hereinafter referred to as "control part 21") is a control circuit comprised mainly of a memory such as a microprocessor, RAM, ROM, or the like, and a circuit that accompanies the memory (both are not shown in the figure). The control part 21 has a function of comprehensively controlling respective parts of the signal processing circuit 20.

A signal switching part 22 is a signal switching circuit for switching, with respect to each of the channels, between a test signal supplied from the signal generator 30 and a sound signal supplied from the sound source signal supply circuit, and supplying the signal to a group of equalizer circuits in a subsequent stage. The switching between the signals is performed with respect to each of the channels according to an instruction from the control part 21.

A standing wave control equalizer part (standing wave control EQ) 23 (hereinafter referred to as "equalizers 23") is a group of equalizer circuits for correcting the low-frequency band from 50 Hz to 250 Hz with respect to each of the channels. Each of the equalizers 23 included in the group has a plurality of GEQs incorporated therein which determine equalizing characteristics. Various parameters such as central frequencies and bandwidths of the GEQs are set for each of the channels according to an instruction from the control part 21.

A sound field correcting equalizer part (sound field correcting EQ) 24 (hereinafter referred to as "equalizers 24") is a group of equalizer circuits for correcting the full audible frequency band (from 50 Hz to 24 kHz, for example) with respect to each of the channels. Each of the equalizers 24 included in the group also has a plurality of GEQs incorporated therein, which determine equalizing characteristics. Similarly to the equalizers 23, various parameters that determine the characteristics of these GEQs are also set for each of the channels according to an instruction from the control part 21.

Channel processing circuits (CH processing circuits) 25 are circuits for adjusting, for each of the channels, respective characteristics of the sound signal of each of the channels such as delay time, attenuance, or a gain. Such adjustment is also performed for each of the channels according to an instruction from the control part 21.

It should be noted that the connection sequence shown in FIG. 2 for connecting the equalizers 23, the equalizers 24, and the channel processing circuits 25 is just an embodiment. It goes without saying that embodiments of the present invention are not limited to such a constitution.

Also, although in the example shown in FIG. 2 the explanation is given by dividing the inside of the signal processing circuit 20 into a plurality of discrete function blocks, the present invention is not limited to such an example. For example, the signal processing circuit 20 may be comprised of a digital signal processor (DSP) including one or more chips so that the processing that is to be performed by the respective function blocks explained above can be executed by software processing using the DSP.

Next, the processing operation of the audio system according to the present embodiment will now be described hereinafter below. The processing operation of the present embodiment is roughly classified into first and second steps. In the first step, various parameters of the GEQs that constitute the equalizers 23 (standing wave control equalizers) are determined for each of the channels. In the second step, a correction is performed on the characteristics of the respective channels by the equalizers 23, whose parameters have been determined in the first step, and then, various parameters of the GEQs that constitute the equalizers 24 (sound field correcting equalizers) are determined.

First, the operation in the first step will be described using a function block diagram shown in FIG. 3. In the first step are detected a peak frequency and an width of a peak that are obtained by analyzing, using a group of high-resolution analytical BPFs, the spectrum of the frequency band of a low-frequency band (50-250 Hz), wherein a generated standing wave causes an auditory problem in a sound space. Then, various parameters of a plurality of GEQs that constitute the equalizers 23 are determined to correct the peak. It should be noted that FIG. 3 illustrates the processing operation for one channel, and an element such as the channel processing circuit 25 that does not have a direct relation to the principle of the processing operation of the present invention is omitted from the figure, and so is the explanation thereof.

Figure 3:
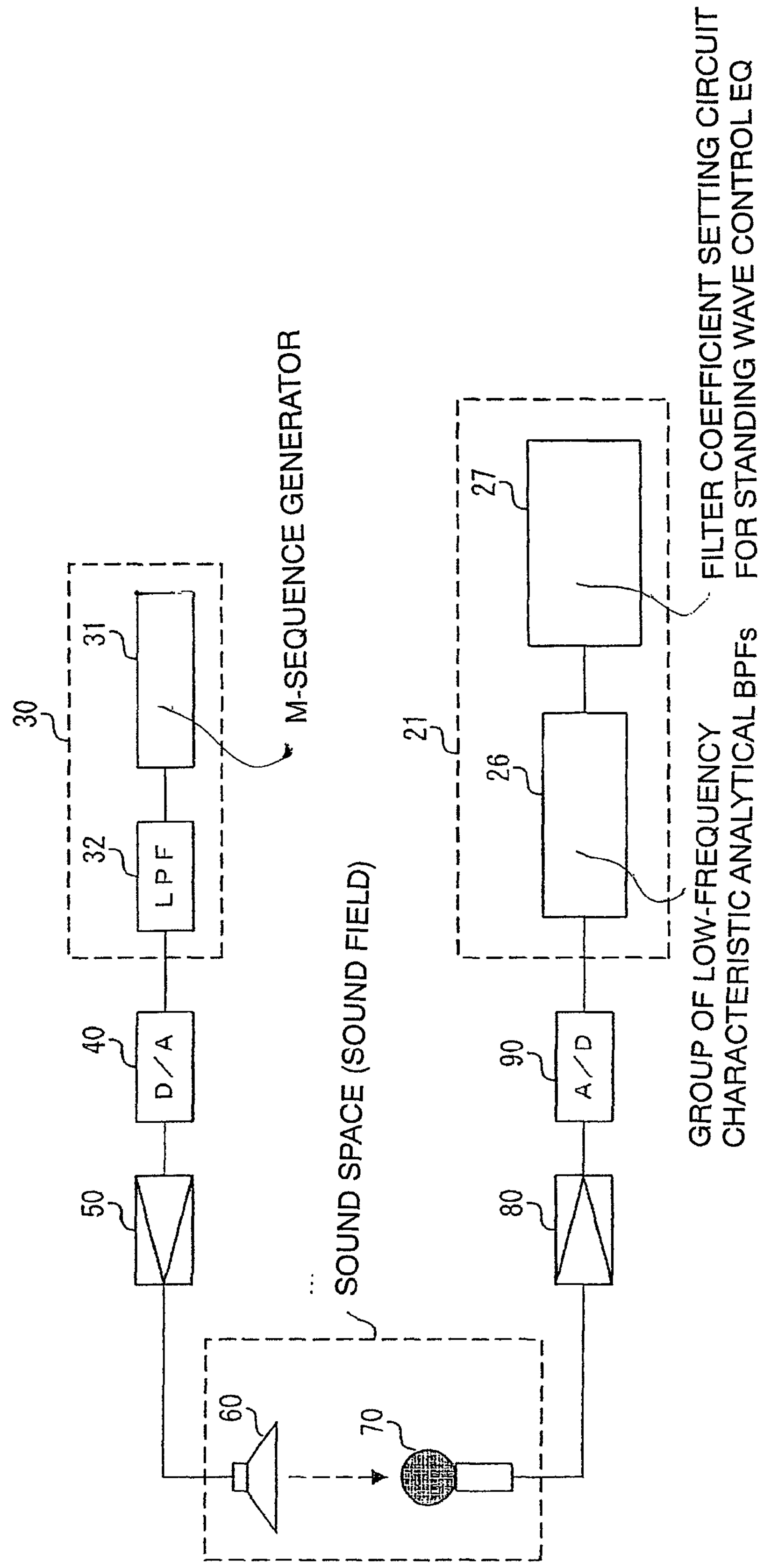
FIG. 3 is a function block diagram illustrating processing operation performed in a first step of the present embodiment.

In FIG. 3, the signal generator 30 first generates a random noise of M-sequence from an M-sequence (Maximum length code) generator 31 incorporated therein to obtain a frequency resolution high enough to measure characteristics of a sound field. The noise signal supplied from the generator is passed through a lowpass filter 32 that has the characteristics of, for example, a cutoff frequency of 500 Hz and a slope of −12 dB/oct so that components other than low-frequency components may be removed from the noise signal. The noise signal is then supplied to the loudspeaker 60 via the DAC 40 and the signal amplifier 50 and the like. Needles to say, a signal selector switch of the signal switching part 22 has been, at this point, switched over to the side of a test signal.

Changes in sound pressure of a sound signal delivered from the loudspeaker 60 propagate through a sound space within the sound field, detected by the microphone 70, and then, converted into an electric signal that follows the sound pressure changes. The electric signal is supplied to a group of low-frequency characteristic analytical BPFs 26 (hereinafter referred to as "BPF group 26") provided inside of the control part 21 via the signal amplifier 80 and the ADC 90.

Figure 4:
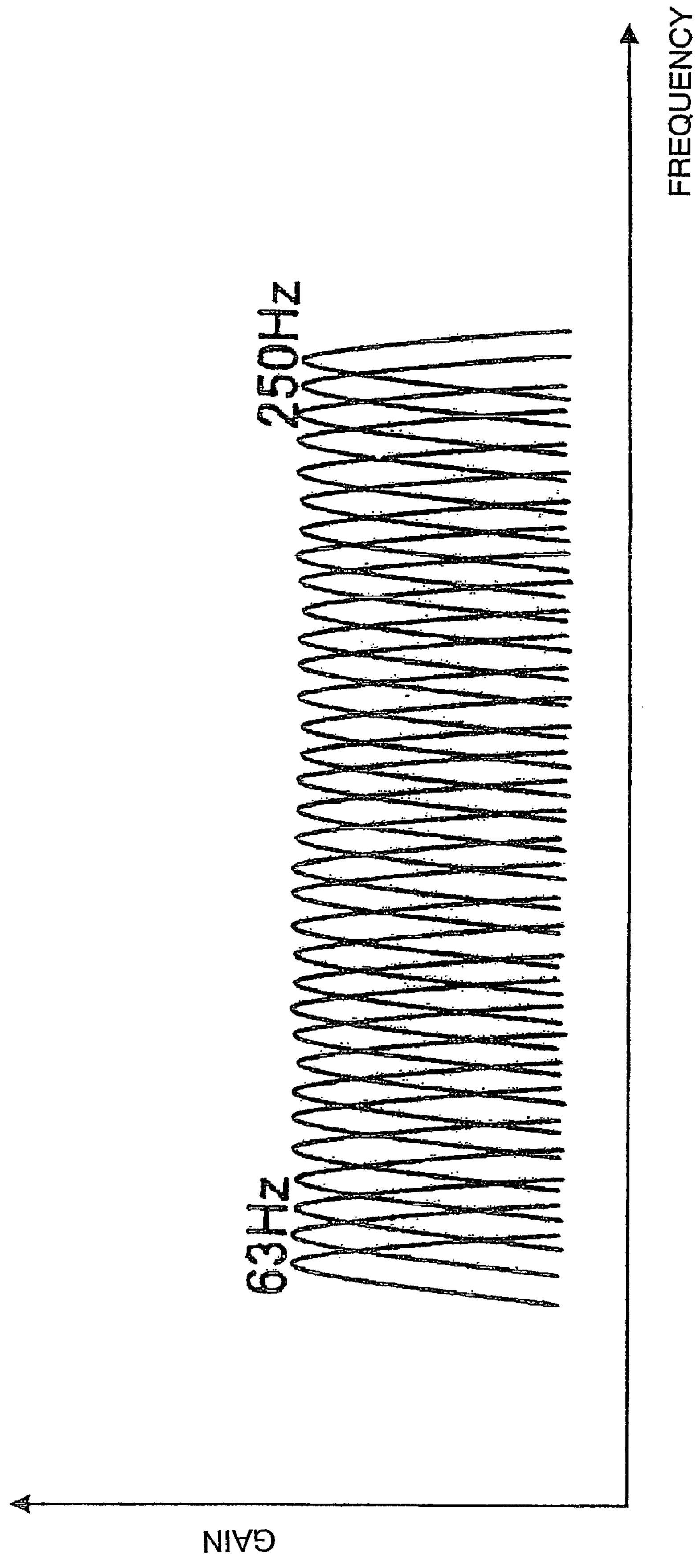
FIG. 4 is a chart illustrating filter characteristics of respective BPFs that constitute a group of low-frequency characteristic analytical BPFs 26 shown in FIG. 3.

The BPF group 26 is a group of BPFs provided for analyzing the low-frequency band, which is greatly affected by a standing wave. The BPF group 26 may be constructed, as shown in FIG. 4, by dividing the low-frequency band between 50 HZ to 250 Hz into thirty-three BPFs having relatively high selectivity factor (Q-factor) (the Q-factor being about 20) to obtain a high frequency resolution.

A microprocessor (not shown) within the control part 21 sequentially scans the thirty-three BPFs that constitute the BPF group 26 to detect an existence of a peak generated by a standing wave in the low-frequency band at an extremely high frequency resolution. The respective BPFs that constitute the BPF group 26 have high Q-factor and a long signal group delay time, and thus, correct data can be obtained by setting a measurement data acquisition time at a long time period of, for example, 1.4 seconds.

Based on the measurement results, the microprocessor within the control part 21 determines the parameters of each of the GEQs that constitute the equalizer 23 by using a filter coefficient setting circuit 27 for the standing wave control equalizer (hereinafter referred to as "setting circuit 27"). The parameters of the GEQ include, for example, a central frequency fO, the selectivity factor (Q-factor), and attenuance ATT of each of the GEQs that constitute the equalizers 23.

A standing wave generated in a sound space has the property determined by the shape, size, or environment of a sound field, i.e., a listening room. Peak frequencies generated by the standing waves in low-frequency bands are therefore not very different from one another among the channels. Taking note of such a property, in the present embodiment, basically, same values are used for all of the channels as the parameters of the respective GEQs that constitute the equalizers 23.

However, with respect to a channel like a C channel or a SW channel of a 7.1 channel stereo system, for example, wherein the sound outputting device is likely to be placed directly on the floor of a listening room, chances are high that the effects of a standing wave may be different from those in other channels. Therefore, if measured characteristics data are apparently different from those of front channels or surround channels, parameters will be set differently from other chancels with respect to the C channel or SW channel. Even in such a case, however, same parameters will be set for the other channels.

As a technique for setting common parameters among the respective GEQs that constitute the equalizers 23, various methods as follows are available.

Figure 7:
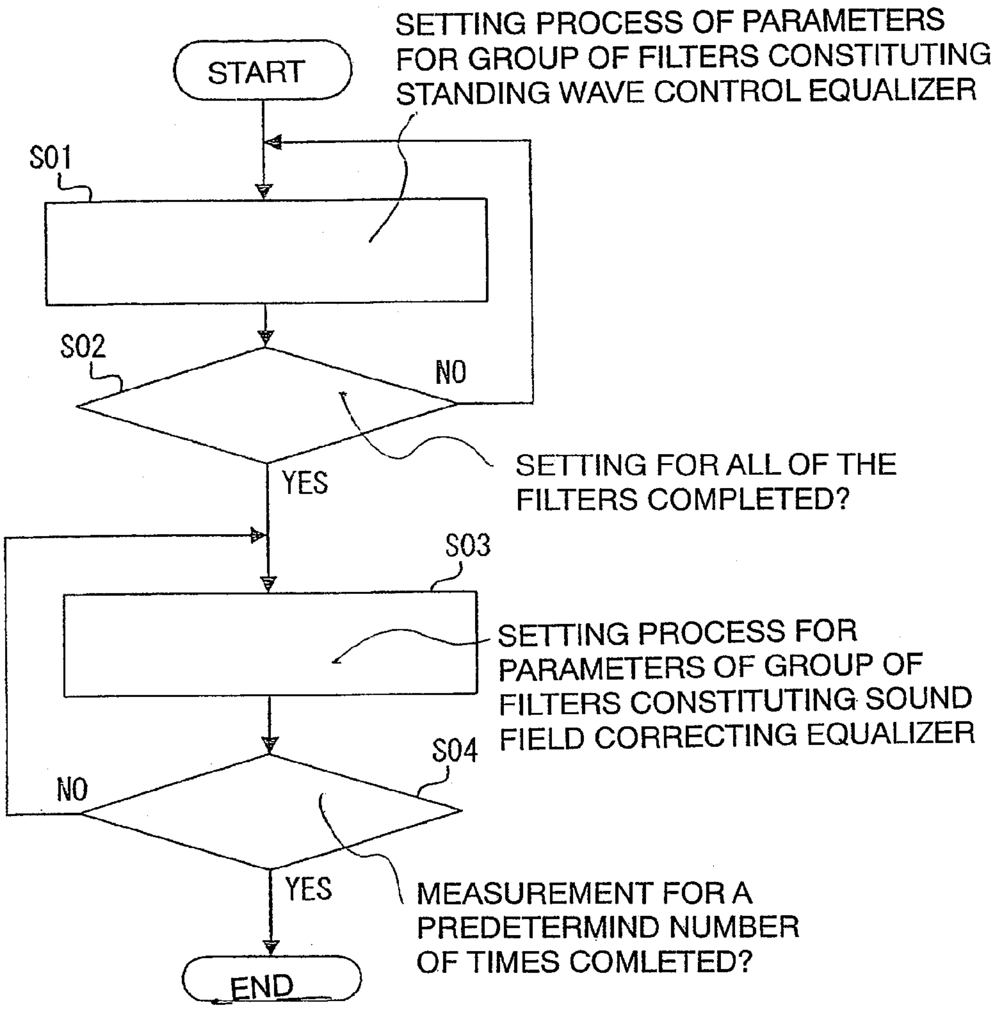
FIG. 7 is a flow chart showing the processing sequence of equalizer adjustment according to the present embodiment.

For example, a highest peak is picked out among the data measured in front channels, parameters of a first one of the GEQs that constitute the equalizers 23 are set such that the peak may be corrected. Using the equalizer 23, wherein coefficients are set in the above manner, the front channels are again measured, and parameters of a second one of the GEQs and ones after the second one included in the equalizers 23 are set. Then, parameters of the respective GEQs that constitute the equalizers 23 may be sequentially set after repeatedly measuring other channels such as surround channels. Otherwise, parameters of the respective GEQs that constitute the equalizers 23 may be set by averaging out the data measured in the respective channels and correcting a peak obtained by the average value. The processing operation to be executed in the first step is shown in steps S01 and S02 in a flowchart of FIG. 7.

Next, the processing operation in the second step of the present embodiment will be described with reference to a function block diagram shown in FIG. 5. Similarly to the case of the first step, the figure is a block diagram that functionally illustrates the processing operation in one channel.

Figure 5:
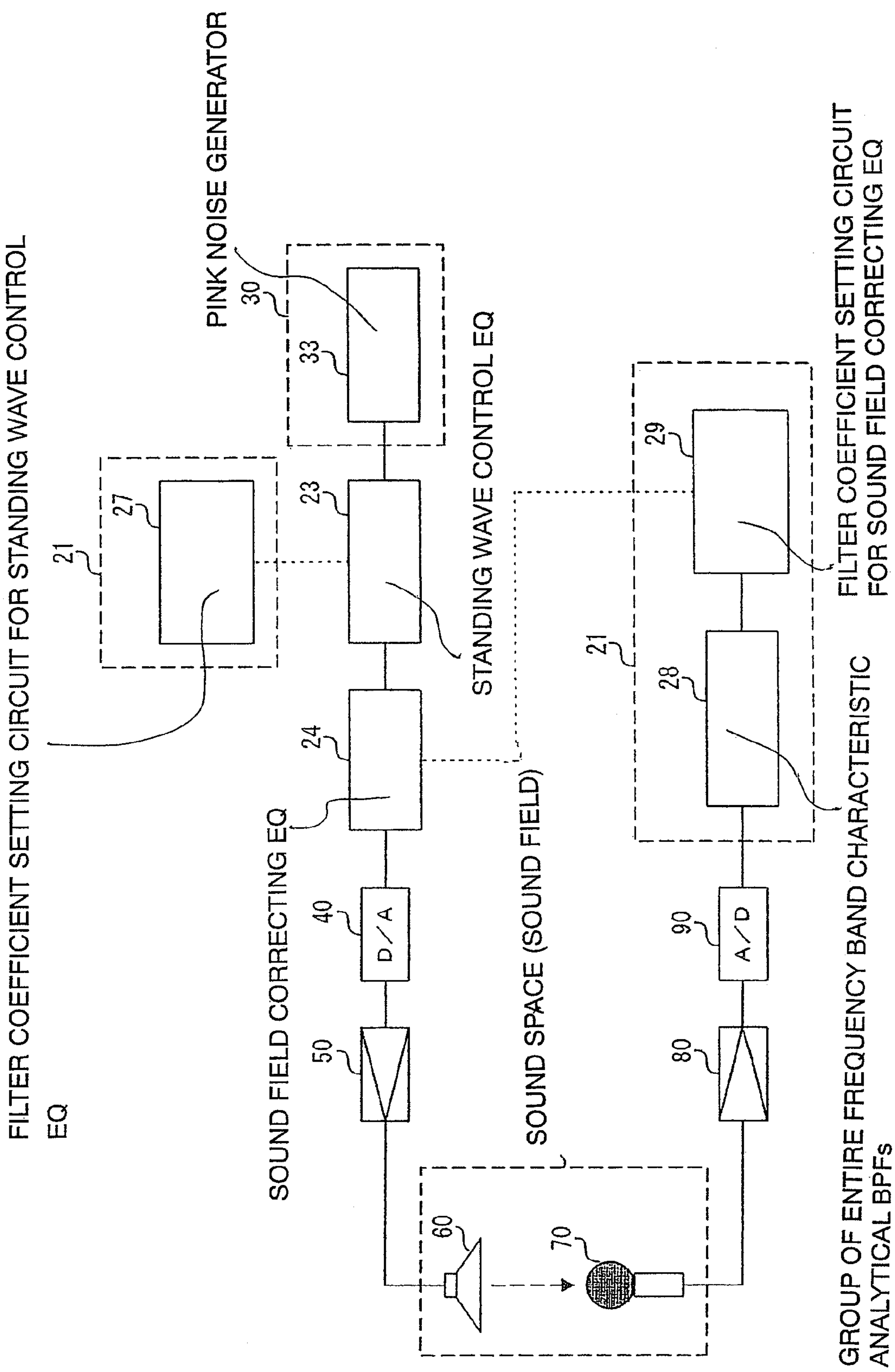
FIG. 5 is a function block diagram illustrating processing operation performed in a second step of the present embodiment.

In FIG. 5, the signal generator 30 generates, as a test signal, a pink noise that is obtained by assigning a weight of −3 dB/oct to a white noise from a pink noise generator 33 incorporated therein. The test signal outputted from the pink noise generator 33 is supplied to a cascade connection part comprised of equalizers 23 and 24 via the signal selector switch of the signal switching part 22.

Here, respective parameters of the respective filters that constitute the equalizer 23, which controls a standing wave, are set as determined in the first step by the setting circuit 27 provided inside of the control part 21. On the other hand, characteristics of the equalizer 24, which controls a sound field correction, are set to have flat characteristics before subjected to a correction.

After passing through the two equalizers, the test signal is supplied to the loudspeaker 60 via the DAC 40 and the signal amplifier 50 and the like. Changes in the sound pressure of a sound signal delivered from the loudspeaker 60 propagate through the sound space within the sound field, and then, detected by the microphone 70 to be converted into an electric signal that follows the sound pressure changes. The electric signal is then supplied to a group of entire frequency band characteristic analytical BPFs 28 (hereinafter referred to as "BPF group 28") provided inside of the control part 21 via the signal amplifier 80 and the ADC 90.

Figure 6:
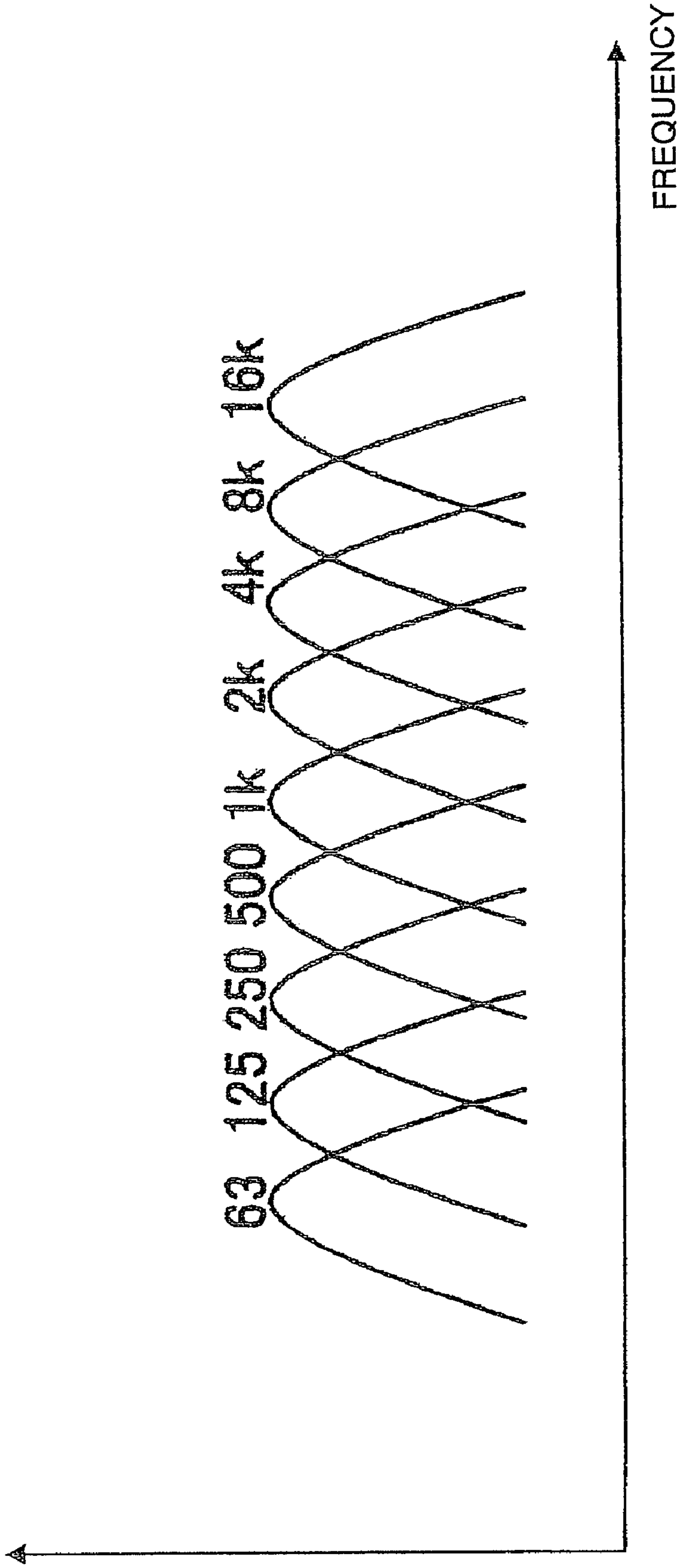
FIG. 6 is a chart illustrating filter characteristics of respective BPFs that constitute a group of entire frequency band characteristic analytical BPFs 28 shown in FIG. 5.

The BPF group 28 is a group of BPFs provided for analyzing entire frequency band in the audio system shown in FIG. 1. As shown in FIG. 6, the BPF group 28 is comprised of nine BPFs having central frequencies of 63 Hz, 125 Hz, 250 Hz, 500 Hz, 1 k Hz, 2 k Hz, 4 k Hz, 8 k Hz, and 16 k Hz, and having relatively low Q-factor. It goes without saying that the constitution of the BPF group 28 shown in the same figure is just an example, and embodiments of the present invention are not limited to such a constitution.

The microprocessor of the control part 21 (not shown) sequentially scans the BPFs of ninebands that constitute the BPF group 28 and measures frequency characteristics of the sound space over the entire band. Based on the measurement results, parameters of the respective BPFs that constitute the equalizer 24 are determined by using a filter coefficient setting circuit 29 for the sound field correcting equalizer (hereinafter referred to as "setting circuit 29"). The parameters include, for example, a central frequency fO, the selectivity factor (Q-factor), and attenuance ATT of the respective BPFs.

The microprocessor in the control part 21 sets parameters of the respective GEQs included in the equalizer 24 at parameters determined by the setting circuit 29, and then, repeats tests again using test signals supplied from the pink noise generator 33 to sequentially correct the parameters at which the equalizer 24 is to be set. It is assumed that the parameters at which the parameters of the equalizer 23 for controlling a standing wave are set are continuously held at the values set in the first step. According to the present embodiment, precision of the sound field correction characteristics obtained in the equalizer 24 can be improved by repeating the routine for a predetermined number of times. The processing operation to be executed in the second step is shown in steps S03 and S04 in the flowchart of FIG. 7.

As explained above, according to the present embodiment, a frequency analysis is performed on the low-frequency band, which is greatly affected by a standing wave, using a group of BPFs comprised of many of narrow band filters having high Q-factor, and thus, a sufficient frequency resolution can be obtained for detecting a peak caused by the effects of a standing wave. In addition, the use of a white noise, as a test signal, that is generated by an M-sequence generator eliminates the gaps among signal spectrum and thereby improving the measurement precision.

Furthermore, in the present embodiment, parameters of the standing wave control equalizers, for which filters having relatively high Q-factor are used, are basically set at same parameters for the respective channels. Thus, phases of the respective channels are in agreement with one another and it becomes possible to produce correct sound field characteristics.

Moreover, in the present embodiment, the characteristics of the standing wave control equalizers are corrected, and then, at the corrected equalizing characteristics are set characteristics of the pink noise as the test signal. After that, characteristics of the sound field correcting equalizer are corrected. Thus, the balance between the bands covering the full band of the sound field correcting equalizers can be aligned.

In conventional sound field correction, correction results become unstable if a peak due to a standing wave exists, and thus, it took time to converge correction characteristics of the sound filed correcting equalizer. According to the present embodiment, however, the peak generated due to the standing wave has been preliminarily suppressed at the time of correcting the characteristics of the sound field correcting equalizer. Correction values therefore do not change drastically, and it becomes possible to converge the correction characteristics within a short time.

In the embodiment explained above, a white noise from an M-sequence generator is used as a correction test signal for the standing wave control equalizer. However, an output signal from the M-sequence generator subjected to predetermined filtering may be used as the correction test signal. Also, not an M-sequence noise signal but a signal generated by obtaining a long period impulse response or by a many point Fast Fourier Transform (FFT) processing may be used as the correction test signal.

Furthermore, the coincidence of phases of signals passing through the respective channels may be achieved by using a finite impulse response (FIR) filter.

In addition, the entire band of the audio system may be analyzed in further detail by high-resolution filters, and many narrow band filters may be used as correction filters for the equalizers. Alternatively, such a system may be realized by using FIR filters.

This application is based on Japanese Patent Application No. 2005-202307 which is hereby incorporated by reference.

What is claimed is:

1. An audio system including a group of loudspeakers that form a sound field by delivering into a single space sound signals passed through respective ones of a plurality of sound signal channels, the audio system comprising:

two characteristic-variable equalizers cascaded to each other to constitute a part of the sound signal channels;

a sound field characteristics detecting part for supplying test signals through the sound signal channels and detecting sound pressure in the sound field and thereby obtaining a sound pressure signal; and a characteristics adjusting part for adjusting, based on the sound pressure signal, equalizing characteristics of the characteristic-variable equalizers individually and with respect to each of the sound signal channels, wherein the sound field characteristics detecting part generates a test signal having low frequencies within an audible frequency band, and then, a test signal having entire frequency band within the audible frequency band, wherein the characteristics adjusting part adjusts equalizing characteristics of the upstream side equalizer out of the two characteristic-variable equalizers for all of the sound signal channels when the test signal generated by the sound field characteristics detecting part is a low-frequency signal, and then, equalizing characteristics of the downstream side equalizer out of the two characteristic-variable equalizers for all of the sound signal channels when the test signal generated by the sound field characteristics detecting part is an entire range frequency signal.

2. The audio system according to claim 1, wherein the characteristics adjusting part includes a group of low-frequency characteristic analytical band pass filters that are used when the test signal generated by the sound field characteristics detecting part is a low-frequency signal, and a group of entire frequency band characteristic analytical band pass filters that are used when the test signal generated by the sound field characteristics detecting part is an entire range frequency signal, and wherein Q-factor of the low-frequency characteristic analytical band pass filter group is higher than that of the entire frequency band characteristic analytical band pass filter group.

3. The audio system according to claim 1, wherein the characteristics adjusting part adjusts equalizing characteristics of the upstream side equalizer to be same characteristics with respect to all of the sound signal channels.

4. The audio system according to claim 1, wherein the characteristics adjusting part adjusts equalizing characteristics of the upstream side equalizer with respect to a part of the sound signal channels to be different characteristics from those of the other channels that have been set to be same characteristics.

5. The audio system according to claim 1, wherein the low-frequency signal is a white noise signal generated by an M-sequence state variable generator, and the entire range frequency signal is a noise signal obtained by assigning a predetermined weight to a spectrum of the white noise.

6. The audio system according to claim 1, wherein the low-frequency signal is a signal lying within a low-frequency band from 50 Hz to 250 Hz, and the entire range frequency signal is a signal lying within an entire audible frequency band including the low-frequency band.

7. The audio system according to claim 1, wherein the sound field characteristics detecting part detects sound pressure at one or a plurality of position(s) within the sound field.

* * * * *